United States Patent
Kraft et al.

(10) Patent No.: US 6,628,116 B1
(45) Date of Patent: Sep. 30, 2003

(54) PROCESS AND APPARATUS TO REMOVE STIMULATED ECHO ARTIFACTS CAUSED BY INTERACTIONS OF A PREPARATION SEQUENCE WITH A GRADIENT ECHO SEQUENCE IN MR IMAGING

(75) Inventors: Robert A. Kraft, Menomonee Falls, WI (US); Jeffrey A Hopkins, Pewaukee, WI (US)

(73) Assignee: GE Medical Systems Global Technology Co., LLC, Waukesha, WI (US)

( * ) Notice: Subject to any disclaimer, the term of this patent is extended or adjusted under 35 U.S.C. 154(b) by 0 days.

(21) Appl. No.: 09/682,470

(22) Filed: Sep. 6, 2001

(51) Int. Cl.$^7$ ................................................. G01V 3/00
(52) U.S. Cl. ........................................ 324/307; 324/309
(58) Field of Search ................................. 324/300, 306, 324/307, 309, 318, 312

(56) References Cited

U.S. PATENT DOCUMENTS

| | | | | |
|---|---|---|---|---|
| 4,684,893 A | * | 8/1987 | Kojima et al. | 324/312 |
| 5,124,650 A | * | 6/1992 | Granot | 324/309 |
| 5,729,139 A | * | 3/1998 | Goto | 324/309 |
| 6,127,825 A | * | 10/2000 | Goto | 324/307 |
| 6,218,834 B1 | * | 4/2001 | Goto | 324/307 |
| 6,320,377 B1 | * | 11/2001 | Miyazaki et al. | 324/306 |
| 6,483,305 B1 | * | 11/2002 | Miyamoto | 324/307 |
| 6,559,643 B2 | * | 5/2003 | Miyoshi | 324/309 |

OTHER PUBLICATIONS

A P Crawley and R M Henkelman "A stimulated echo artifact from slice interface in magnetic resonance imaging," Med Phy 1987 (14 (5):842.

S Singh, B K Rutt and R M Henkelman, "Projection presaturation. A fast and accurate technique for multi-dimensional spatial localization," J Mag Res, 1990, 87:567.

Y Zur. M L Wood and L J Neuringer, Spoiling of transverse magnetization in steady-state sequences. Mag Res. Med 1991 21:251.

* cited by examiner

Primary Examiner—Louis Arana
Assistant Examiner—Tiffany A. Fetzner
(74) Attorney, Agent, or Firm—Ziolkowski Patent Solutions Group, LLP; Michael A. Della Penna; Carl B. Horton

(57) ABSTRACT

The present invention is directed to a process and system for removing artifacts resulting from the interactions of a preparation sequence and a gradient echo sequence. A process for suppressing stimulated echoes for spatial preparation sequences without affecting sequence timing or image contrast is disclosed. Stimulated echoes often form when gradient crushers of a preparation sequence are constant in magnitude and direction throughout the imaging sequence. Changing the direction or effective areas of these gradient crushers throughout imaging acquisition prevents stimulated echoes from forming, thereby eliminating ghosting and blurring artifacts. By applying unbalanced gradients or sets of unbalanced gradients between selective RF pulses of an RF pulse sequence, signals attributable to spin transverse magnetization are suppressed resulting in reduced ghosting and/or artifacts. Additionally, the process varies the phase of each RF pulse with each application of the RF pulse to minimize any artifacts generated by stimulated echoes.

27 Claims, 5 Drawing Sheets

PROCESS AND APPARATUS TO REMOVE STIMULATED ECHO ARTIFACTS CAUSED BY INTERACTIONS OF A PREPARATION SEQUENCE WITH A GRADIENT ECHO SEQUENCE IN MR IMAGING

BACKGROUND OF INVENTION

The present invention relates generally to MR imaging and, more particularly, to a method and system to remove artifacts caused by interactions of a preparation sequence and a gradient echo sequence in MR imaging.

Typically, MR systems apply chemical shift preparation sequences commonly referred to as "fat suppression" to an imaging space to suppress signals attributable to fat within an imaging subject. Reconstructing images after employing a chemical shift preparation sequence often produces a cleaner and more discernable image for diagnostic analysis. There are several known techniques of performing chemical shift imaging including a saturation technique.

With the saturation method, a frequency selective saturation pulse is applied before standard RF pulses of an imaging sequence, e.g., a spin-echo sequence. The saturation pulse operates to set the magnetization along the transverse plane of the component to be suppressed to zero. As a result, the application of the standard imaging sequence thereafter significantly reduces any signal from the suppressed component. Therefore, most signals from the suppressed component, i.e. fat, are not detected and used in final image reconstruction. A spatial saturation preparation sequence using slice selective RF pulses instead of chemically selective RF pulses may also be used to suppress spatial components of an imaging subject. Unfortunately, application of either a fat suppression sequence or a spatial saturation sequence may interact with a subsequent gradient echo sequence to generate unwanted stimulated echo artifacts.

Multi-sliced gradient echo images acquired with fat or spatial suppression preparation sequences often exhibit ghosts and/or blurring from the suppressed signal. These artifacts, which are typically generated by stimulated echoes, allow the suppressed signal from one slice to be refocused into another slice and are created through a combination of chemically selective and/or spatially selective RF pulses with a gradient echo sequence. If there is a constant phase between the suppression sequence RF pulses and the gradient echo RF pulses, then the suppressed signal appears to be blurred from slice to slice. If there is a linear phase shift from view to view between RF pulses, then the refocused signal will oftentimes appear as a severe ghost in the final reconstructed image.

Referring to FIG. 1, a schematic representation of an imaging space 2 with refocused stimulated echoes is shown. Specifically, FIG. 1 illustrates the refocusing of a signal excited by a preparation sequence from one slice into another. A protocol was prescribed such that half of the prescribed slices were outside the phantom and half the slices were inside the phantom. Prescribing slices outside the phantom provides a convenient method to observe ghosts generated by the stimulated echoes. FIG. 1 is a collection of axial images acquired with a gradient echo sequence with a spatial saturation applied through the center of the phantom. As shown, the signal excited by the intersection 4 of the preparation sequence 6 and the slice selective RF pulses 8 is refocused from one slice to another slice. This cross-talk results in severe ghosting occurring in a final reconstructed image. Ultimately, signals from stimulated echoes are refocused from one slice into another yielding a contaminated reconstructed image.

It would therefore be desirable to design a system implementing a technique that removes artifacts caused by interactions of a preparation sequence and a gradient echo sequence in MR imaging.

BRIEF DESCRIPTION OF INVENTION

The present invention is directed to a process and system for removing artifacts resulting from the interactions of a preparation sequence and a gradient echo sequence in MR imaging. The present invention includes a process for suppressing stimulated echoes created from preparation sequences without affecting sequence timing or image contrast. Stimulated echoes often form when gradient crushers of a preparation sequence are constant in magnitude and direction throughout the imaging sequence. Changing the direction of these gradient crushers throughout the imaging acquisition prevents stimulated echoes from forming, thereby eliminating ghosting and blurring artifacts. By applying unbalanced gradients or sets of unbalanced gradients between selective RF pulses of an RF pulse sequence, signals attributable to spin transverse magnetization are suppressed resulting in a reconstructed image with reduced ghosting and/or artifacts. Additionally, the present invention includes a process that varies the phase of each RF pulse with each application of the RF pulse to minimize any artifacts generated by stimulated echoes.

Therefore, in accordance with one aspect of the invention, a method is provided to remove artifacts caused by interactions of a preparation sequence and a gradient echo sequence in MR imaging. The method includes the steps of applying a first train of RF pulses to an imaging space and applying a set of gradients having an effective gradient area $G_1$ across the imaging space. The method also includes the steps of applying a second train of RF pulses to the imaging space followed by application of another set of gradients having an effective gradient area $G_2$, wherein $G_1 \neq |G_2|$.

In accordance with another aspect of the present invention, a computer program includes a set of instructions that when executed by a computer causes the computer to apply a first preparation sequence of RF pulses to an imaging subject. The transverse magnetization generated by the RF pulses is then crushed by applying a gradient factor, $G_1$, before a second spatial saturation pulse sequence. The computer program further causes the computer to create a gradient field having a gradient factor $G_2$ across the imaging space so as to suppress the stimulated echo caused by the first preparation pulse sequence. The gradient fields are applied such that the gradient factor $G_1$ of the first applied gradient field and the gradient factor $G_2$ of the second applied gradient field are unbalanced with respect to one another.

In accordance with yet another aspect of the present invention, an MR apparatus includes a magnetic resonance imaging system having a plurality of grading coils positioned about a bore of a magnet to impress a polarizing magnetic field and an RF transceiver system. The MR apparatus further includes an RF switch controlled by a pulse module to transmit RF signals to an RF coil assembly to acquire MR images. The apparatus also includes a computer programmed to determine a number of RF pulses of a preparation sequence and then determine a phase increment $\phi_o$ for the preparation sequence. The computer is further programmed to determine a phase variation factor $\phi_n$ and then apply an RF pulse having a phase variation factor of $\phi_n$ to an imaging space.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention.

In the drawings.

DETAILED DESCRIPTION

Figure 1:
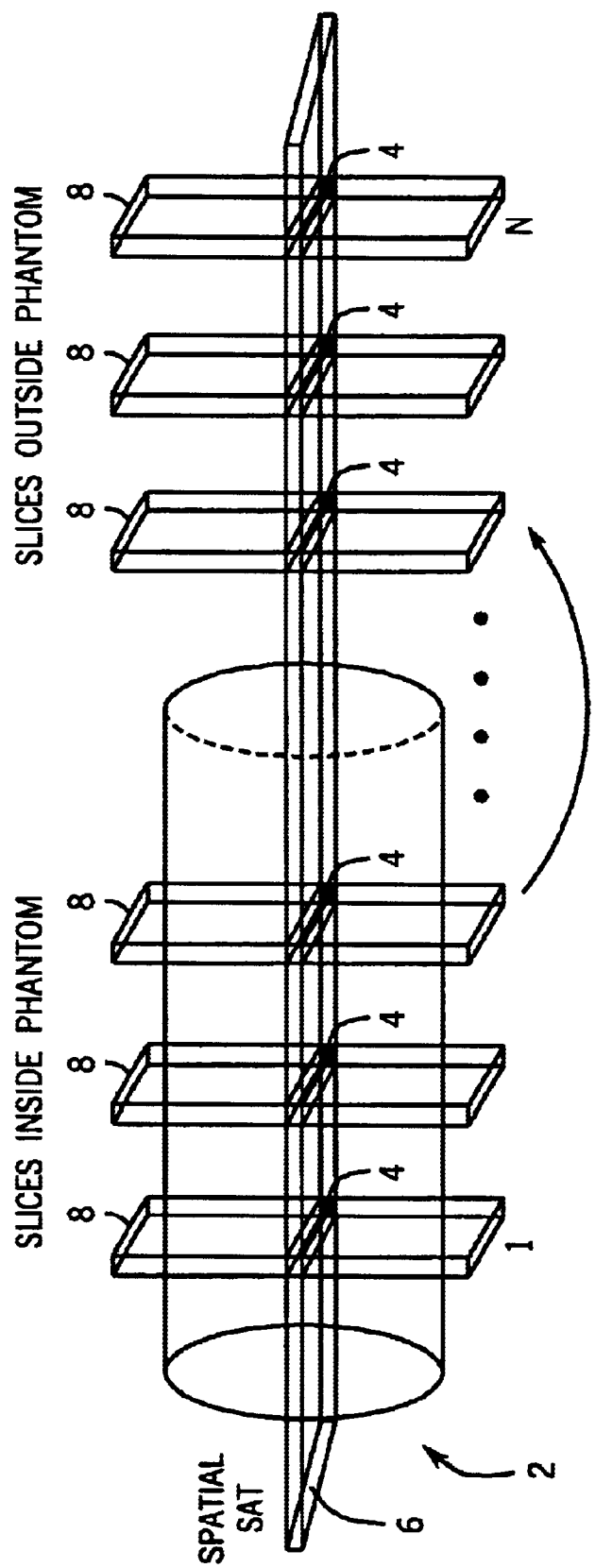
FIG. 1 is a schematic representation of refocused signals extending from one slice into another as a result of interactions between a preparation sequence and a gradient echo sequence using conventional imaging techniques.
Figure 2:
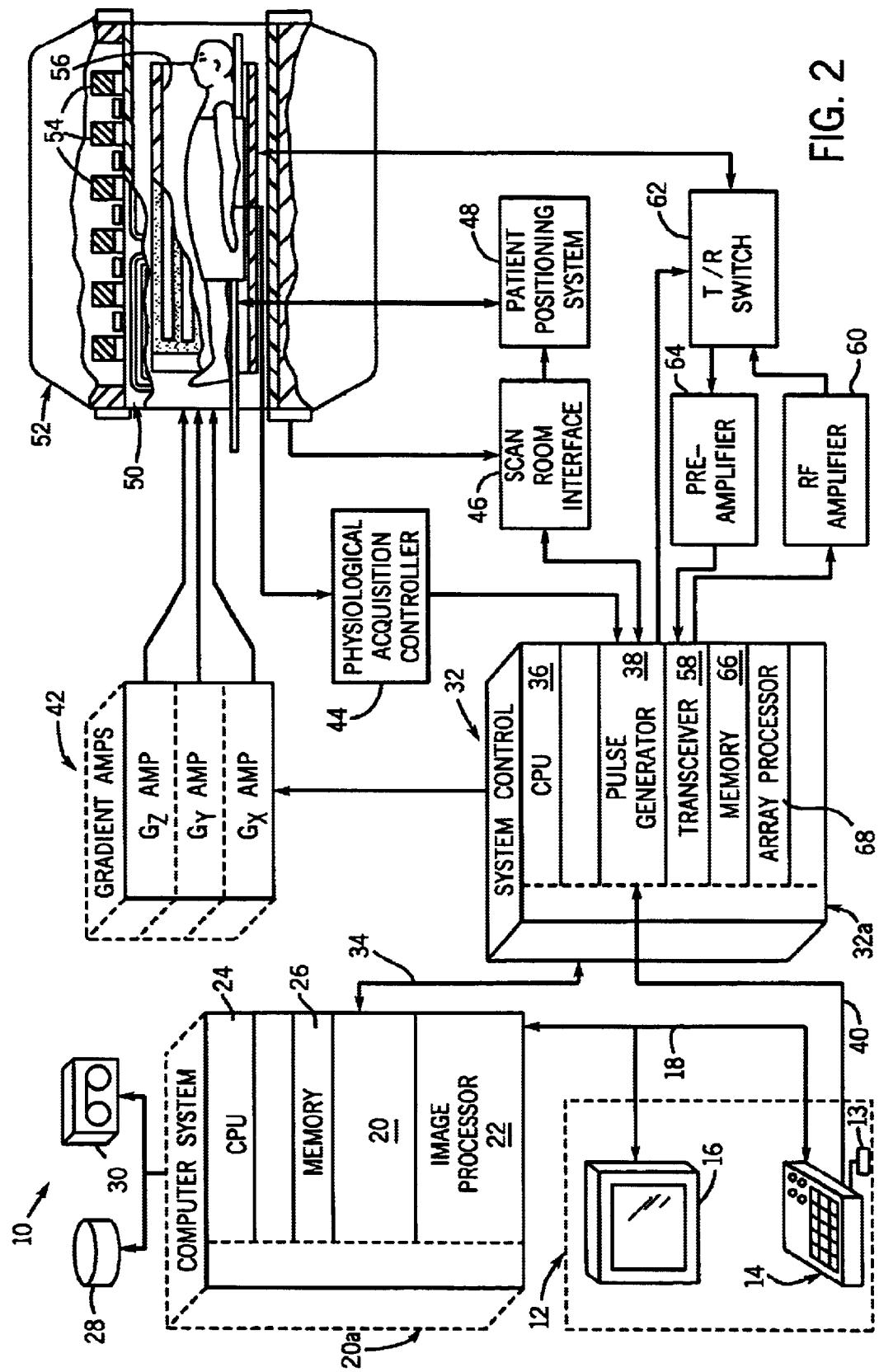
FIG. 2 is a schematic block diagram of an MR imaging system for use with the present invention.

Referring to FIG. 2, the major components of a preferred magnetic resonance imaging (MRI) system 10 incorporating the present invention are shown. The operation of the system is controlled from an operator console 12 which includes a keyboard or other input device 13, a control panel 14, and a display 16. The console 12 communicates through a link 18 with a separate computer system 20 that enables an operator to control the production and display of images on the screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention includes a system and process for suppressing stimulated echoes that result from the interaction of a preparation sequence with a gradient echo sequence. Stimulated echoes often form when gradient crushers of the preparation sequence are constant in magnitude and direction throughout an imaging sequence. A stimulated echo may be created when spins of nuclei within the imaging space are excited by three RF pulses and no gradients are applied. Stimulated echoes may also be created in the presence of applied gradients if the gradient area between a first and second RF pulse and after a third RF pulse is balanced. That is, stimulated echoes may form if the gradient area between the first and second RF pulse equals the gradient area after the third RF pulse. For example, prior to a first RF pulse, the spins are in equilibrium. That is, the spins are oriented along a longitudinal equilibrium. Application of a first RF pulse excites the spins from their longitudinal equilibrium position into the transverse plane wherein the spins have a flip angle of $\tau/2$ and a phase of y. This condition may be represented by:

$$I_Z \xrightarrow{\pi/2|_y} I_X = 1/2(I_- - I_+) \quad \text{(Eqn. 1)}$$

wherein $I_Z$ represents the orientation of the spins along a longitudinal equilibrium whereas $I_X$ is representative of spin position within the transverse plane.

Using Cartesian based product operators $I_X$, $I_Y$, $I_Z$ it becomes clear that the RF pulse rotates the spins into the transverse plane, which is similar to the classical interpretation of the effect of an RF pulse on a spin. While it is certainly possible to represent the effect of gradients and/or RF pulses as they are applied to a spin system using Cartesian expressions, the present invention implements Annihilation and Creation (AC) product operators, I+ and I−, to represent the effect of gradients and RF pulses on a spin system. Simple transformations between Cartesian and AC expressions are set forth in the table below.

| Cartesian | Annihilation and Creation |
|---|---|
| $I_x$ | ½ ($I_-$ − $I_+$) |
| $I_y$ | ½ ($I_-$ + $I_+$) |
| $I_x$ − i $I_y$ | $I_-$ |
| $I_x$ + $I_y$ | $I_+$ |

As indicated previously, after application of the first RF pulse, the spins within the imaging space rotate into the transverse plane. As a result, the transverse magnetization, $I_Z$, of the spins is converted into its AC equivalent. After applying a set of gradient magnetic fields across the imaging space and after the first RF pulse, the transverse magnetization of the spins is suppressed or "crushed". This "crushing" effect may be represented by the following equation:

$$1/2(I_- - I_+) \xrightarrow{G_1} 1/2(e^{-i2\pi\gamma \overline{G1} \cdot r} I_- - i e^{+i2\pi\gamma \overline{G1} \cdot r} I_+) \quad \text{(Eqn. 2)}$$

Application of a second RF pulse of a train of RF pulses excites half of the crushed transverse magnetization back to the longitudinal position and may be defined by the following equation:

$$1/2(I_- - I_+) \xrightarrow{G_1} 1/2(e^{-i2\pi\gamma \overline{G1} \cdot r} I_- - i e^{+i2\pi\gamma \overline{G1} \cdot r} I_+) \xrightarrow{\pi/2|_y} \quad \text{(Eqn. 3)}$$
$$1/4(e^{-i2\pi\gamma \overline{G1} \cdot r} + e^{+i2\pi\gamma \overline{G1} \cdot r}) I_- - 1/4(e^{-i2\pi\gamma \overline{G1} \cdot r} + e^{+i2\pi\gamma \overline{G1} \cdot r}) I_+ + 1/2(e^{i2\pi\gamma \overline{G1} \cdot r} - e^{-i2\pi\gamma \overline{G1} \cdot r}) I_Z$$

This condition following application of the second RF pulse is commonly referred to as "storing magnetization along z". Since the stored magnetization is longitudinal, application of a set of gradients after the second RF pulse has no effect on this magnetization. However, if the second set of gradient pulses has the same effective area as the first set of gradient pulses, the spins will be refocused to form an echo, i.e., a Hahn echo. Conversely, however, if the second set of gradient pulses has an effective area unequal to the effective area of the first set of gradient pulses, the transverse magnetization will be further crushed.

Following a third RF pulse, the spins that were stored along z in the transverse plane return and may be defined by the following equation:

$$1/2(e^{i2\pi\gamma \overline{G1} \cdot r} - e^{-i2\pi\gamma \overline{G1} \cdot r}) I_Z \xrightarrow{\pi/2|_y} \quad \text{(Eqn. 4)}$$
$$1/4(e^{+i2\pi\gamma \overline{G1} \cdot r} - e^{-i2\pi\gamma \overline{G1} \cdot r}) I_- + 1/4(e^{-i2\pi\gamma \overline{G1} \cdot r} - e^{+i2\pi\gamma \overline{G1} \cdot r}) I_+$$

After the third RF pulse, the spins that have been returned to the transverse plane are still crushed by the first set of gradients, however, if a third set of gradients has the same effective area as the first set of gradients, the spins are refocused and a stimulated echo results. This condition may be defined by the following equation:

$$1/4(e^{+i2\pi\gamma \overline{G1} \cdot r} - e^{-i2\pi\gamma \overline{G1} \cdot r}) I_- + 1/4(e^{-i2\pi\gamma \overline{G1} \cdot r} - e^{+i2\pi\gamma \overline{G1} \cdot r}) I_+ \xrightarrow{G_3} \quad \text{(Eqn. 5)}$$
$$1/4(e^{+i2\pi\gamma (\overline{G1}-\overline{G3}) \cdot r} - e^{-i2\pi\gamma (\overline{G1}+\overline{G3}) \cdot r}) I_- + 1/4(e^{-i2\pi\gamma (\overline{G1}-\overline{G3}) \cdot r} - e^{+i2\pi\gamma (\overline{G1}+\overline{G3}) \cdot r}) I_+$$

Simply, a stimulated echo is formed when $G_1=|G_3|$. However, application of a third set of gradients having an effective gradient area $G_3$ wherein $G_1 \neq |G_3|$ will be sufficient to suppress ghosting of artifact causing signals.

Figure 3:
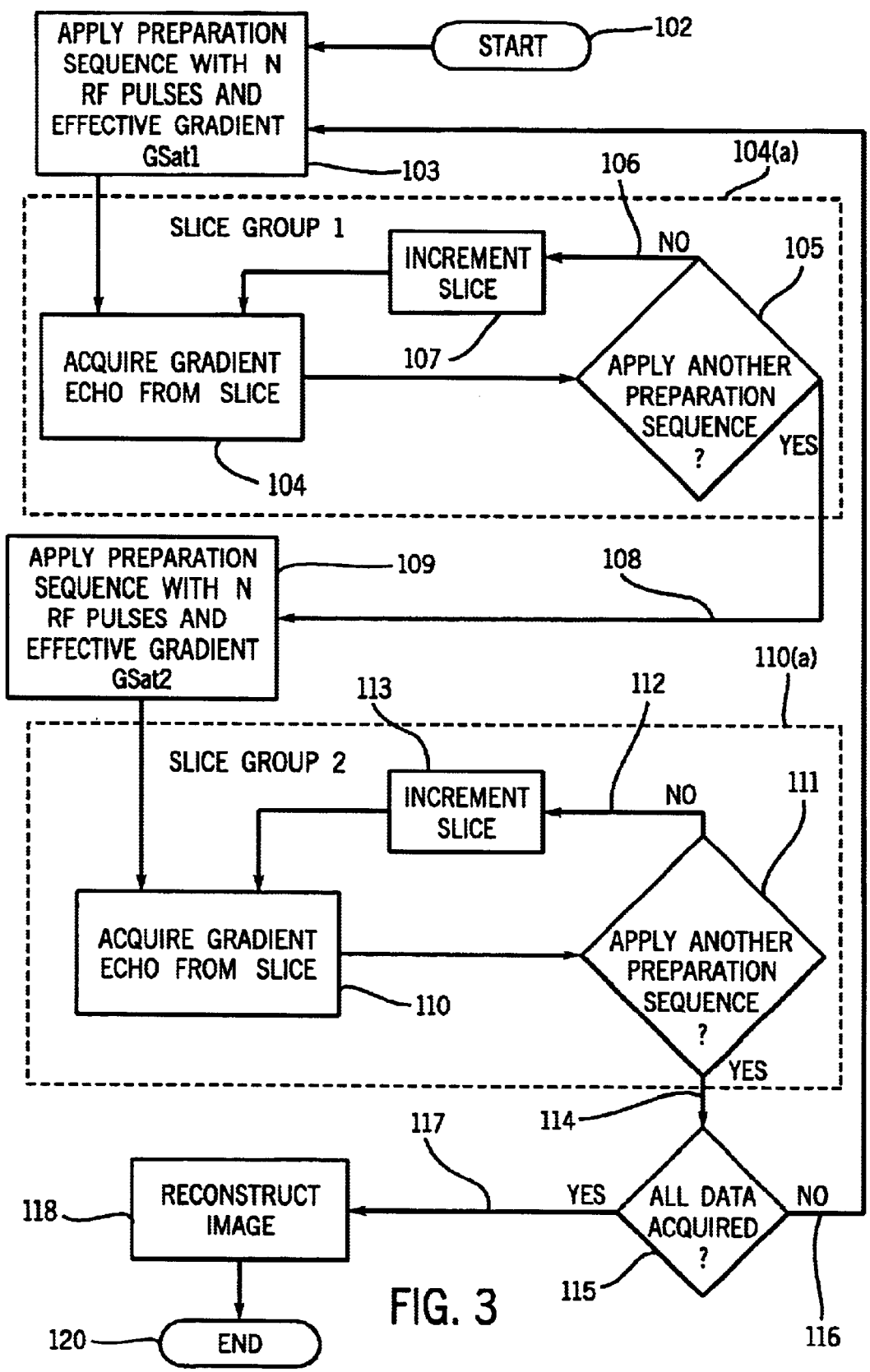
FIG. 3 is a flow chart setting forth the steps of a process for removing artifacts caused by interactions of a preparation sequence and a gradient echo sequence in accordance with the present invention.

Accordingly, the present invention includes a process for applying sets of gradients having unbalanced effective gradient areas to an imaging space to reduce artifacts caused by interactions between a preparation sequence and a gradient echo sequence. An effective gradient area may be defined as the area sum of all crusher, readout, phase encode, and slice encode gradients necessary to acquire MR data. Referring to FIG. 3, a process 100 for suppressing artifacts caused by the interaction between a preparation pulse sequence and a gradient echo sequence begins at 102 with the application of a preparation sequence with n RF pulses and effective gradient $GSAT_1$ at 103. The preparation sequence gradients $GSAT_1$ and the imaging gradients combine to have an effective gradient $G_1$. At 104, gradient echoes are acquired for slice 1 of a first slice group 104(a) following a slice selective RP pulse of the gradient echo imaging sequence. The present invention contemplates selective application of gradient crushers. Therefore, at 105 the process determines if another preparation sequence should be applied for slice group 1. Typically, a slice group comprises four slices. That is, in one preferred embodiment, a preparation sequence with n RF pulses is applied every fourth slice. Therefore, if no additional preparation sequences need to he applied 105, 106, the slice is incremented at 107 by one for subsequent echo acquisition at 104. If however, another preparation sequence is to be applied 105, 108, another preparation sequence with n RF pulses and an effective gradient $GSAT_2$ is applied at 109. Imaging gradients from slices after application of the slice selective gradient at 104 and before application of the preparation sequence with n RF pulses at 109, combine to form an effective gradient $G_2$. This effective gradient includes all readout, phase and slice encode gradients necessary to acquire data. If $G_2$ equals $G_1$, the spins of the nuclei within the imaging space will be refocused to form a Hahn echo. However, if $G_2$ does not equal $G_1$, half of the previously crushed transverse magnetization will be excited back to a longitudinal position, i.e., storing magnetization along z.

At 110, gradient echoes are acquired for a first slice of a second slice group 110(a). In one embodiment, the slices of slice group 1 must be at a different location than the slices of slice group 2. Similar to acquisition of gradient echoes for slice group 1, acquisition of gradient echoes from slice group 2 continues at 111 with a determination as to whether another preparation sequence should be applied. If not 111, 112, the slice is incremented at 113 for additional gradient echo acquisition at 110. However, if another preparation sequence is to be applied 114, i.e., another slice group, the process continues to 115 to determine if all data necessary for image reconstruction has been acquired. If not 116, the process returns to 103 for further data acquisition with gradient crushing whenever necessary.

Preparation sequence gradients $GSAT_2$ and imaging gradients applied after application of the preparation sequence at 109 combine to have an effective gradient $G_3$. This effective gradient includes all crusher, readout, phase encode, and slice encode gradients necessary to acquire data. Moreover, to suppress stimulated echoes forming as a result of interaction between the preparation sequence and the gradient echo sequences, the effective gradient area $G_3 \neq G_1$. Selection/determination of the appropriate gradient area to crush the stimulated echoes may be determined by a number of methods including a direct analysis of the spin of the nucleus or a historical analysis of the previously applied gradients.

Still referring to FIG. 3 if all data has been acquired for image reconstruction 115, 117, an image is reconstructed at 118 whereupon the process concludes at 120.

A stimulated echo forms when the gradients before acquisition of gradient echoes for slice 1 and after application of the preparation sequence and effective gradient $G_2$ are balanced with respect to one another. The effective gradient $G_1$ is composed of the preparation suppression sequence, $GSAT_1$, and all imaging gradients before acquisition of the gradient echo from slice 1 at 104. Since the signal for acquisition of gradient echoes from slice 1 at 104 represents any slice in slice group 1, the effective gradient $G_1$ will change according to which slice is represented by the signal 104. Effective gradient $G_2$ is composed of all imaging gradients after application of the slice selective signal at 104 and before application of the preparation sequence at 109. The effective crushing area of $G_2$ will also change depending upon which slice selective RF pulse is implemented or used at 104. The effective gradient at $G_3$ is composed of the gradients after application of the preparation sequence at 109 and before application of the slice selective RF pulse at 110. The slice selective RF pulse at 110 may represent any slice selective RF pulse in slice block 2. However, the slice selective RF pulse from step 104 and the slice selective pulse from step 110 must represent the same n RF pulse in their respective slice group. That is, if the slice selective pulse applied at 104 represents the second slice selective RF pulse in slice group 1, then the slice selective pulse applied at 110 must represent the second slice selective RF pulse in slice group 2. This condition is necessary so the contribution of the imaging gradients for the effective gradient $G_1$ and $G_2$ are balanced. This allows the preparation sequence gradient to be modulated to crush the stimulated echoes. Essentially, the condition that $G_1 \neq G_3$ may be met if $GSAT_1 \neq GSAT_2$.

In a preferred embodiment, three RF pulses are applied followed by three sets of gradient crushers. However, the present invention is not limited to application with a suppression preparation sequence having three RF pulses and/or application of three sets of gradients. That is, the present invention is applicable with a preparation sequence having n RF pulses and application of n sets of gradients. It remains important however, that the effective gradient areas be unbalanced. For example, the effective gradient area of an n th set of gradients must not equal the absolute value of gradient area $G_1$. Simply, $G_n \neq |G_1|$.

Figure 4:
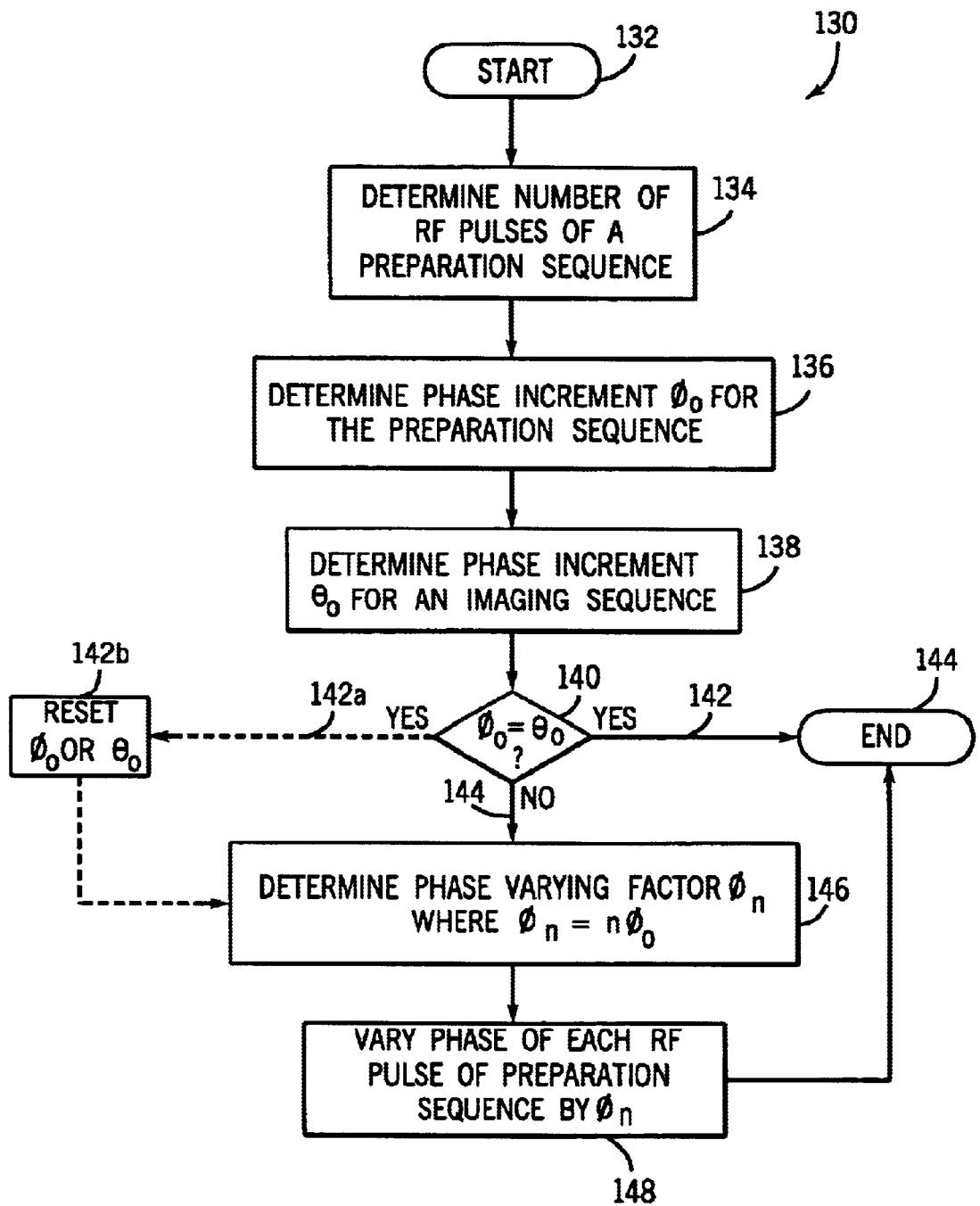
FIG. 4 is a flow chart setting forth the steps of a process for minimizing artifacts in MR imaging in accordance with the present invention.

In another embodiment of the present invention and referring to FIG. 4, a process 130 for minimizing artifacts generated by stimulated echoes begins at 132 by determining a number of RF pulses of a preparation sequence at 134. A phase increment $\phi_o$ for the preparation sequence is then determined at 136. A phase increment $\theta_0$ for an imaging sequence is then determined at 138 and compared to the phase increment $\phi_o$ for the preparation sequence at 140. If the phase increment $\phi_o$ is equal to the phase increment $\theta_0$ 142, the process 130 terminates at 144. Note that in an alternate embodiment as illustrated by the dashed lines, if $\phi_o = \theta_0$ at 140, 142a, the phase increment $\phi_o$ for the preparation sequence or the phase increment $\theta_0$ for the imaging sequence may be reset such that $\phi_o \neq \theta_0$ at 142b. If $\phi_o \neq \theta_0$ 140, 144, a phase varying factor $\phi_n$ is determined at 146. In one embodiment, the phase varying factor $\phi_n$ is defined by the linear function $\phi_n = n\phi_o$, where n is the number of RF preparation pulses determined at 134, and $\phi_o$ is the phase increment for the preparation sequence determined at 138. The phase varying factor $\phi_n$ need not be defined at all times by this linear function. That is, any function may be used to define the phase varying factor $\phi_n$.

Following determination of the phase varying factor $\phi_n$ at 146, each phase of an RF pulse of a preparation sequence is varied by the phase varying factor $\phi_n$ at 148. For example, the phase of a first RF pulse would have a phase $\Phi_1$ equal to $\Phi_o$. However, the phase of a second RF pulse would be defined as twice $\Phi_o$ or simply, $\Phi_n = 2\Phi_o$. Following this pattern, the phase of a third RF pulse of a preparation sequence has a phase $\Phi_3$=to $3\Phi_0$. Ultimately, an $n^{th}$ pulse would have phase $\Phi_n = n\Phi_o$. Altering the phase of each RF pulse each time the RF pulse is applied effectively spoils the preparation sequence and thereby minimizes artifacts generated by stimulated echoes which form as a result of interactions between a gradient echo sequence and a preparation sequence. To fully minimize the artifacts, the phase increment for the preparation sequence $\Phi_o$ must be independent of the phase increment for an imaging sequence $\theta_0$. That is, $\Phi_o \neq \theta_0$. Process 130 ends at 144 following phase varying of the last RF pulse.

Figure 5:
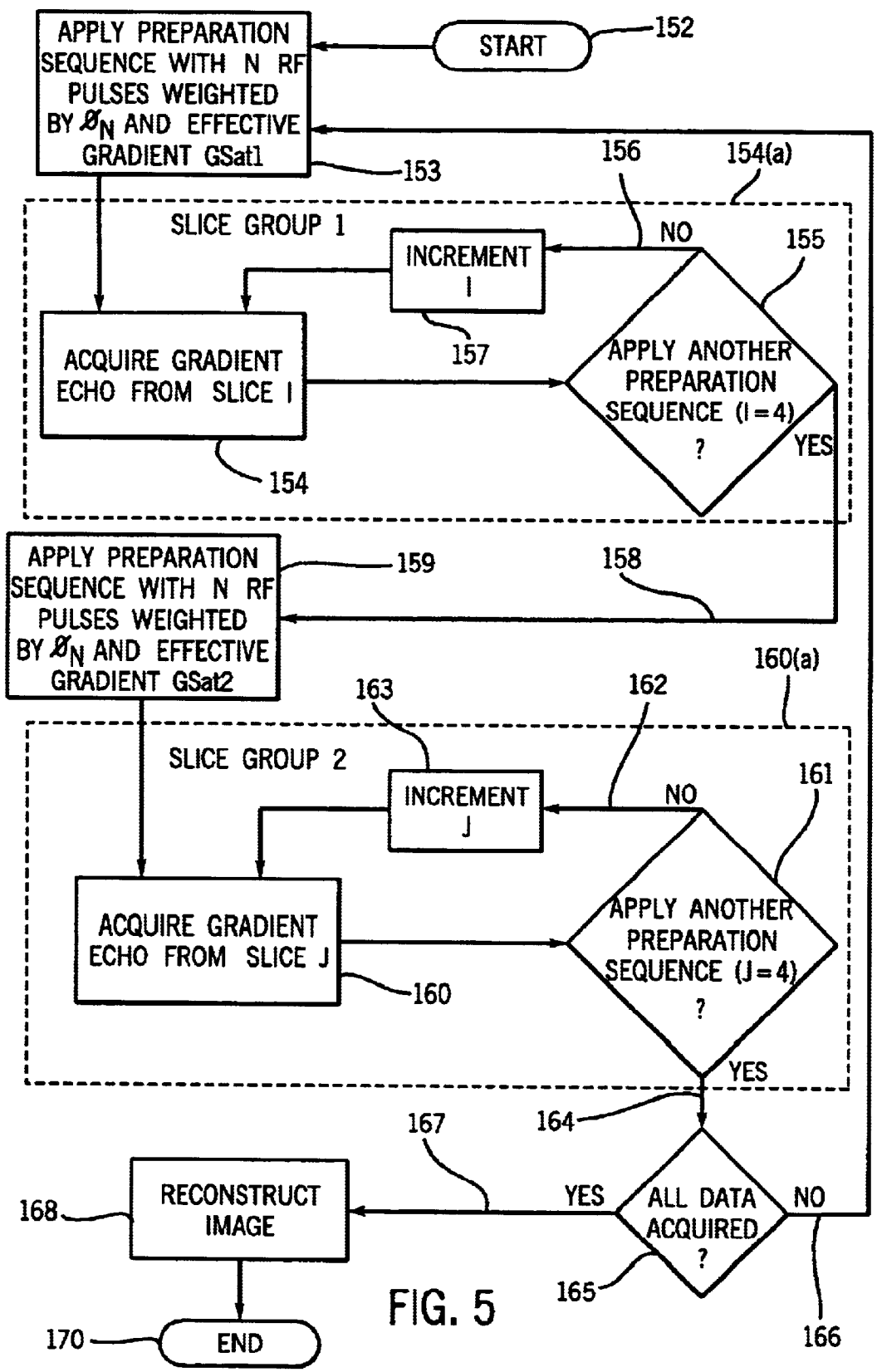
FIG. 5 is a flow chart setting forth the steps for a comprehensive process to suppress artifacts caused by interactions of a preparation sequence and a gradient echo sequence employing the processes set forth in FIGS. 3–4.

Referring to FIG. 5, the steps of a process 150 incorporating another embodiment of the present invention are set forth. Process 150 is similar to process 100 of FIG. 3 insofar as applying unbalanced gradients to an imaging space, but incorporates the RF spoiling process 130 of FIG. 4. Process 150 for suppressing artifacts caused by the interaction between a preparation pulse sequence and a gradient echo sequence begins at 152 with the application of a preparation sequence with n RF pulses and effective gradient $GSAT_1$ at 153. The RF pulses are applied with a phase varying factor $\Phi_n$, where $\Phi_n = n\Phi_o$. Varying the phase of each RF pulse spreads the energy associated with each pulse throughout the image, thereby reducing artifacts in the final image. The preparation sequence gradients, $GSAT_1$, and the imaging gradients combine to have an effective gradient $G_1$. At 154, gradient echoes are acquired for slice 1 of slice group 154(a) following a slice selective RF pulse of the gradient echo imaging sequence.

The present invention contemplates selective application of gradient crushers. Therefore, at 155 the process determines if another preparation sequence should be applied for slice group 1. Typically, a slice group comprises four slices. That is, in one preferred embodiment, a preparation sequence with n RF pulses is applied every fourth slice. Therefore, if no additional preparation sequences need to be applied 155, 156, the slice is incremented at 157 by one for subsequent echo acquisition at 154. If however, another preparation sequence is to be applied 155, 158, another preparation sequence with n RF pulses and an effective gradient $GSAT_2$ is applied at 159. Again, the phase of each RF pulse is varied by $\phi_n$ to spread the signal energy throughout the imaging space. Imaging gradients from slices after application of the slice selective gradient at 154 and before application of the preparation sequence with n RF pulses at 159, combine to form an effective gradient $G_2$. This effective grading includes all readout, phase and slice encode gradients necessary to acquire data. If $G_2$ equals $G_1$, the spins of the nuclei within the imaging space will be refocused to form a Hahn echo. However, if $G_2$ does not equal $G_1$, half of the previously crushed transverse magnetization will be excited back to a longitudinal position, i.e., storing magnetization along z.

At 160, gradient echoes are acquired for a first slice of a second slice group 160(a). In one embodiment, the slices of slice group 1 must be at a different location than the slices of slice block 2. Similar to acquisition of gradient echoes for slice group 1, acquisition of gradient echoes from slice group 2 continues at 161 with a determination as to whether another preparation sequence should be applied. If not 161, 162, the slice is incremented at 163 for additional gradient echo acquisition at 160. However, if another preparation sequence is to be applied 164, the process continues to 165 to determine if all data necessary for image reconstruction has been acquired. If not 166, the process returns to 153 for further data acquisition with gradient crushing when necessary.

Preparation sequence gradients $GSAT_2$ and imaging gradients applied after application of the preparation sequence at 159 combine to have an effective gradient $G_3$. This effective gradient includes all crusher, readout, phase encode, and slicing encode gradients necessary to acquire data. Moreover, to suppress stimulated echoes forming as a result of interaction between the preparation sequence and the gradient echo sequences, is imperative, and in accordance with the present invention, that effect gradient area $G_3 \neq G_1$. Selection/determination of the appropriate gradient area to crush the stimulated echoes may be determined by a number of methods including a direct analysis of the spin of the nucleus by itself or a historical analysis of the previously applied gradients. If all data has been acquired for image reconstruction 165, 167, an image is reconstructed at 168 whereupon the process concludes at 170.

In accordance with a further embodiment of the present invention, a computer program includes a set of instructions that when executed by a computer causes the computer to apply a preparation sequence of RF pulses to an imaging subject. The transverse magnetization generated by the RF pulses is then crushed by applying a gradient factor, $G_1$. The computer program further causes the computer to create, before a second spatial saturation pulse sequence, a gradient field having a gradient factor $G_2$ across the imaging space so as to suppress the stimulated echo caused by the first spatial saturation pulse sequence. The gradient fields are applied such that the gradient factor $G_1$ of the first applied gradient field and the gradient factor $G_2$ of the second applied gradient field are unbalanced with respect to one another.

In a further embodiment of the present invention, an MR apparatus includes a magnetic resonance imaging system having a plurality of grading coils positioned about a bore of a magnet to impress a polarizing magnetic field and an RF transceiver system. The MR apparatus further includes an RF switch controlled by a pulse module to transmit RF signals to an RF coil assembly to acquire MR images. The apparatus also includes a computer programmed to determine a number of RF pulses of a preparation sequence and then determine a phase increment $\phi_o$ for the preparation sequence. The computer is further programmed to determine a phase variation factor $\phi_n$ and then apply an RF pulse having a phase of $\phi_n$ to an imaging space.

The present invention has been described in terms of the preferred embodiment, and it is recognized that equivalents, alternatives, and modifications, aside from those expressly stated, are possible and within the scope of the appending claims.

What is claimed is:

1. A method to reduce artifacts caused by interactions of two preparation sequences with a gradient echo sequence in MR imaging, the method comprising the steps of:
   applying a first preparation sequence having a train of RF pulses to an imaging space;
   applying a set of gradients that includes preparation suppression sequence gradients before acquisition of a gradient echo for one slice, having an effective gradient area, $G_1$, across the imaging space for the first preparation sequence;
   applying a gradient echo sequence having a train of RF pulses for slice selection;
   applying a set of gradients that includes imaging gradients;
   applying a second preparation sequence having a train of RF pulses to the imaging space; and
   applying a set of radients that includes preparation suppression sequence gradients having an effective gradient area, $G_2$ across the imaging space for the second preparation sequence, wherein $G_1 \neq |G_2|$ to reduce artifacts caused by pulse sequence interactions.

2. The method of claim 1 further comprising the step of applying another gradient echo sequence after the application of an initial gradient echo sequence.

3. The method of claim 1 further comprising the steps of applying N preparation sequence and applying an $n^{th}$ slice selection gradient having a gradient area, $G_N$, wherein $G_N \neq |G_1|$ or $|G_2|$.

4. The method of claim 1 further comprising the steps of:
   determining a value of transverse magnetization of a spin after an initial train of slice selective RF pulses for the gradient echo sequence;
   determining an AC equivalent of the value of the transverse magnetization;
   determining a gradient area value, k, sufficient to suppress the transverse magnetization; and
   applying a set of gradients having an effective gradient area of $G_k$ of the gradient echo sequence.

5. The method of claim 1 further comprising the step of applying a number of sets of preparation sequence gradients, wherein successive sets of gradients have unbalanced effective gradient areas.

6. The method of claim 1 further comprising the step of rotating sets of preparation sequence gradients having unbalanced effective gradient areas between successive trains of gradient echo sequence RF pulses.

7. The method of claim 1 further comprising the step of varying a phase of preparation sequence RF pulses with each application of RF pulses in the preparation sequences.

8. The method of claim 7 further comprising the step of determining a phase variation factor to vary the phase of the preparation sequence, the phase variation factor being defined by:

$$\Phi_n = n\Phi_o.$$

where n is a number of RF pulses;

$\Phi_n$ is a phase of an $n^{th}$ RF pulse; and $\Phi_n$ is a phase increment for the train of RF pulses.

9. The method of claim 8 wherein the phase increment, $\Phi_o$, for a train of RF pulses in the preparation sequences is independent of imaging sequence phase increment, $\Phi_o$.

10. The method of claim 9 wherein $\Phi_o \neq \theta_0$.

11. The method of claim 7 further comprising the step of distributing energy of a stimulated echo signal generated by spin transverse magnetization through an imaging space of a preparation sequence in a phase encode direction.

12. The method of claim 1 wherein a set of gradients includes a read gradient, a phase gradient, and a slice gradient, and wherein an effective gradient area includes a sum of read gradient area, phase gradient area, and slice gradient area.

13. A computer program to reduce artifacts in MR imaging having a set of instructions that when executed by a computer causes the computer to:

apply a first preparation sequence of RF pulses to an imaging space;

create a gradient field across the imaging space having a gradient factor $G_1$, to suppress transverse magnetization caused by the RF pulses;

apply a second preparation sequence of RF pulses to the imaging space;

create, another gradient field having a gradient factor, $G_2$, to suppress a stimulated echo caused by the first preparation sequence; and wherein $G_1$ and $G_2$ are unbalanced with respect to one another.

14. The computer program of claim 13 wherein each preparation sequence is one of a fat saturation preparation sequence and a spatial saturation preparation sequence and the set of instructions further causes the computer to apply another sequence of RF pulses and create at least another gradient field across the imaging space between the first preparation sequence and the second preparation sequence.

15. The computer pronoun of claim 14 wherein the set of instructions further causes the computer to vary a phase of the RF pulses in the preparation sequence each time an RF pulse is applied.

16. The computer program of claim 15 wherein the set of instructions further causes the computer to apply an imaging sequence and determine a number of RF pulses, a phase increment of the preparation sequence, and an imaging sequence phase.

17. The computer program of claim 16 wherein the preparation sequence is a spatial saturation pulse sequence and the phase increment for the spatial saturation pulse sequence, $\Phi_o$, is independent of the imaging sequence phase, $\theta_0$.

18. The computer program of claim 17 wherein the set of instructions further causes the computer to determine a phase of an $n^{th}$ RF pulse sequence, $\Phi_n$, wherein $$\Phi_n = n\Phi_o,$$

where n is the number of RF pulses for the spatial saturation pulse sequence and $\Phi_o$ is the phase increment for the spatial saturation pulse sequence.

19. An MR apparatus comprising:

a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images; and a computer programmed to:

set a phase increment for a preparation sequence different from a phase increment of an imaging sequence;

apply a first preparation sequence at a first phase;

apply a set of gradients that includes preparation suppression sequence gradients before acquisition of an echo for one slice;

apply the imaging sequence;

apply a subsequent preparation sequence at a second phase, wherein the second phase is different from the first phase of the first preparation;

apply a subsequent set of gradients that includes preparation suppression sequence gradients before acquisition of an echo for one slice;

wherein the difference in the phases of the preparation sequences reduces stimulated echo artifacts caused by interaction of multiple preparation sequences and the imaging sequence.

20. The MR apparatus of claim 19 wherein the computer is further programmed to:

determine a number of RF pulses, n, of the preparation sequence;

determine a phase increment, $\Phi_o$, for the preparation sequence;

determine a phase variation factor, $\Phi_n$; and apply RF pulses having a phase of $\Phi_n$; wherein $\Phi_n = n\Phi_o$.

21. The MR apparatus of claim 19 wherein the computer is further programmed to apply a series of unbalanced gradients to an imaging space.

22. The MR apparatus of claim 19 wherein the computer is further programmed to apply a first set of gradients for the fist preparation sequence having an effective gradient area of $G_1$ and apply a second set of gradients for the second preparation sequence having an effective rent area of $G_2$ wherein $G_1 \neq |G_2|$.

23. The MR apparatus of claim 19 wherein the computer is further programmed to apply a first set of gradients for a preparation sequence having an effective gradient area of $G_1$ and a second set of gradients for an imaging sequence having an effective gradient area of $G_2$ and apply a third set of gradients for another preparation sequence having an effective gradient area of $G_3$ wherein $G_1 \neq |G_3|$.

24. The MR apparatus of claim 19 wherein the computer is further programmed to prevent formation of a stimulated echo capable of forming as a result of an interaction of the preparation sequence and a gradient echo sequence.

25. The MR apparatus of claim 19 wherein the computer is further programmed to apply an imaging sequence of RF pulses to the imaging space after the first preparation Sequence and a phase encoding gradient thereafter to acquire a number of gradient echoes for image reconstruction.

26. The MR apparatus of claim 20 wherein $\Phi_n$ is independent of a phase increment, $\theta_0$, for an RF imaging sequence.

27. The MR apparatus of claim 20 wherein thy phase increment for the preparation sequence, $\Phi_o$, is 15°.

* * * * *

UNITED STATES PATENT AND TRADEMARK OFFICE
CERTIFICATE OF CORRECTION

PATENT NO.   : 6,628,116 B1
DATED        : September 30, 2003
INVENTOR(S)  : Kraft et al.

Page 1 of 1

It is certified that error appears in the above-identified patent and that said Letters Patent is hereby corrected as shown below:

Column 12,
Line 41, delete "rent" and substitute therefor -- gradient --;
Line 63, delete "thy" and substitute therefor -- the --.

Signed and Sealed this

Eleventh Day of November, 2003

JAMES E. ROGAN
*Director of the United States Patent and Trademark Office*